(12) United States Patent
Kim et al.

(10) Patent No.: US 7,504,736 B2
(45) Date of Patent: Mar. 17, 2009

(54) SEMICONDUCTOR PACKAGING MOLD AND METHOD OF MANUFACTURING SEMICONDUCTOR PACKAGE USING THE SAME

(75) Inventors: Sang-Uk Kim, Chungcheongnam-do (KR); Han-Shin Youn, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 276 days.

(21) Appl. No.: 11/392,275

(22) Filed: Mar. 28, 2006

(65) Prior Publication Data

US 2006/0214283 A1    Sep. 28, 2006

(30) Foreign Application Priority Data

Mar. 28, 2005    (KR) .................. 10-2005-0025370

(51) Int. Cl.
*H01L 23/28* (2006.01)
*H01L 23/34* (2006.01)

(52) U.S. Cl. .................. 257/796; 257/706; 257/713; 257/787; 257/E21.504

(58) Field of Classification Search .......... 257/787, 257/706, 712, 713, 796, E21.504
See application file for complete search history.

(56) References Cited

U.S. PATENT DOCUMENTS

| 5,289,039 | A | * | 2/1994 | Ishida et al. | ............ 257/796 |
| 5,530,295 | A | * | 6/1996 | Mehr | ............ 257/796 |
| 5,656,864 | A | * | 8/1997 | Mitsue et al. | ............ 257/787 |
| 6,552,428 | B1 | | 4/2003 | Huang et al. | |
| 2002/0076856 | A1 | | 6/2002 | Wensel | |
| 2003/0155648 | A1 | * | 8/2003 | Lo et al. | ............ 257/723 |
| 2005/0285258 | A1 | * | 12/2005 | Chen et al. | ............ 257/706 |

FOREIGN PATENT DOCUMENTS

| JP | 2-37756 | 2/1990 |
| JP | 11-220075 | 8/1999 |
| KR | 0156514 | 7/1998 |
| KR | 2000-0073112 | 12/2000 |

OTHER PUBLICATIONS

English language abstract of Korean Publication No. 2000-0073112.
English language abstract of Japanese Publication No. 11-220075.

* cited by examiner

*Primary Examiner*—Nitin Parekh
(74) *Attorney, Agent, or Firm*—Marger Johnson & McCollom, P.C.

(57) ABSTRACT

A semiconductor packaging mold includes first and second mold bodies, a cavity defined by the first and second mold bodies to provide a space for molding a semiconductor package, and a resin bleed preventing formation on a cavity surface of one of the first and second mold bodies to suppress resin bleeding.

12 Claims, 11 Drawing Sheets

US 7,504,736 B2

SEMICONDUCTOR PACKAGING MOLD AND METHOD OF MANUFACTURING SEMICONDUCTOR PACKAGE USING THE SAME

CROSS-REFERENCE TO RELATED PATENT APPLICATION

This application claims the benefit of Korean Patent Application No. 10-2005-0025370, filed on Mar. 28, 2005, in the Korean Intellectual Property Office, the disclosure of which is incorporated herein in its entirety by reference.

BACKGROUND OF THE INVENTION

1. Field of the Invention

The present invention relates to a semiconductor packaging mold and a method of manufacturing a semiconductor package using the same.

2. Description of the Related Art

A semiconductor wafer is cut into a plurality of single semiconductor chips through a sawing process in an overall assembly process. Each of the semiconductor chips is mounted on a lead frame or a basic frame such as a printed circuit board through a die attaching process. The semiconductor chip, e.g., as mounted on the frame, goes through a wire bonding process whereby a bond pad of the chip electrically connects to a connection terminal of the frame, e.g., by way of a gold wire.

To prevent damage from external impact, the assembly of the semiconductor chip and the frame, as interconnected by the gold wire, is encapsulated by a sealant, e.g., a resin such as an epoxy mold compound, through a molding process.

In recent years, the semiconductor package has been reduced in thickness and increased in the number of pins and in the clock speed. Due to this, undesirably, the semiconductor package generates a large amount of heat. Therefore, many schemes have been developed for effectively discharging heat, as generated within the semiconductor package, to an external side of the package.

One of the schemes integrates a heat spreader within the semiconductor package during the molding process. The heat generated from the semiconductor package is transmitted to atmosphere or to the frame through the heat spreader and is thereby discharged at the external side, thereby protecting electrical properties of the semiconductor package against heat-related deterioration.

To maximize the heat discharge efficiency, the heat spreader as integrated with the semiconductor package is partly exposed at the external side. To accomplish this exposure, therefore, the molding process is performed in a state where a surface of the heat spreader closely contacts a mold cavity surface. In other words, the process aims to prevent resin from flowing or "bleeding" between the mold cavity surface and the heat spreader. Thus, the resin must not cover the external surface of the heat spreader. Undesirably, the sealing resin sometimes bleeds and thinly covers the surface of the heat spreader, and a resin bleed defect results.

FIG. 1 shows a semiconductor package illustrating the resin bleed defect and FIG. 2 shows an enlarged view of a portion A of FIG. 1.

Referring to FIGS. 1 and 2, a typical semiconductor package 30 includes a basic frame 10 such as a printed circuit board, a semiconductor chip 14 physically mounted on the basic frame 10 by a die adhesive 12 and electrically connected to the basic frame 10 by a gold wire 16. A sealing resin 20 encapsulates the semiconductor chip 14 on the basic frame 10. To effectively discharge the heat generated from the semiconductor chip 14 to an external side, a heat spreader 18 is integrated with the semiconductor chip 14 during a molding process and remains partly exposed as an external side of the semiconductor package 30. A plurality of solder balls 22 attach on a bottom of the basic frame 10 to serve as external connection terminals.

In the molding process, to prevent the resin bleed defect, a surface of the heat spreader, which is to remain exposed, must accurately and closely contact an upper mold body 24 (FIG. 2) of the mold. Undesirably, when a ram pressure for filling the sealing resin in a cavity of the mold is too high, there may be a gap between the upper mold body 24 and the surface of the heat spreader. This can allow the sealing resin to bleed into the gap, thereby causing the resin-bleeding defect.

FIGS. 3 and 4 illustrate a typical method of molding a semiconductor package.

Referring to FIGS. 3 and 4, a technology of forming a dam 28 on a heater spreader 18 of a semiconductor package 20' to prevent the resin bleeding defect is discussed in U.S. Pat. Publication No. 2002/0076856 to Richard W. Wensel, Boise entitled "METHOD AND APPARATUS FOR TRANSFER MOLDING ENCAPSULATION OF A SEMICONDUCTOR DIE WITH ATTACHED HEAT SINK" published on Jun. 20, 2002.

FIG. 4 shows an enlarged view of a portion B of FIG. 4.

As shown in FIG. 4, the dam 28 formed on a surface of the heat spreader 18 is designed to block the undesirable bleeding of the sealing resin 20. When transfer pressure applied by a ram to transfer the sealing resin to a cavity of the mold is excessively high, however, the dam 24 cannot perfectly contact an upper mold body 24 (FIG. 4). Thus, the dam 28 cannot always effectively block the bleeding of the sealing resin that causes the resin bleed defect.

SUMMARY

Embodiments of the present invention provide, among other things, a semiconductor packaging mold that can suppress the resin bleed by improving an internal structure of a mold cavity. Embodiments of the present invention further provide a method of manufacturing a semiconductor package using such a semiconductor packaging mold.

In one embodiment, a semiconductor packaging mold comprises first and second mold bodies; a cavity defined by the first and second mold bodies to provide a space to receive a semiconductor package to be molded; and a non-planar resin bleed preventing formation on a surface of the cavity and formed to correspond to a matingly compatible formation of the semiconductor package to be molded.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Embodiments of the present invention will now be described more fully with reference to the accompanying drawings, in which such exemplary embodiments of the invention are shown. The invention may, however, be embodied in many different forms and should not be construed as limited to the embodiments set forth herein; rather, these embodiments are provided as thorough and complete disclosure, and will fully convey the concept of the invention to those skilled in the art.

First Embodiment: A Resin Bleed Groove Formation

Figure 1:
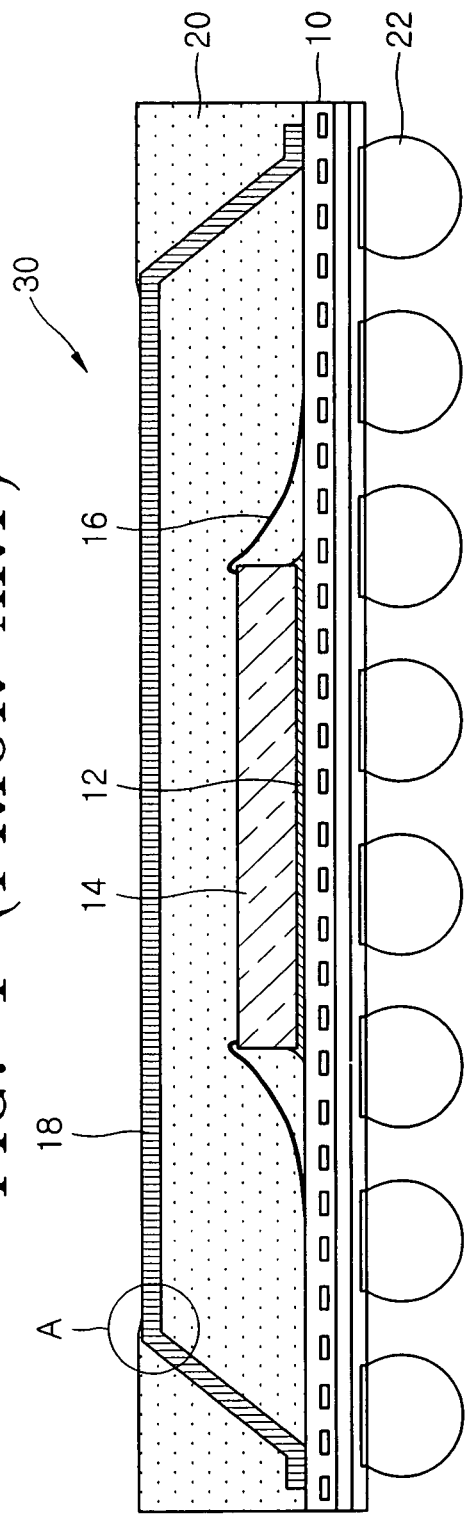
FIG. 1 (Prior Art) is a sectional view of a semiconductor package illustrating a resin bleed defect incurred during a molding process.
Figure 2:
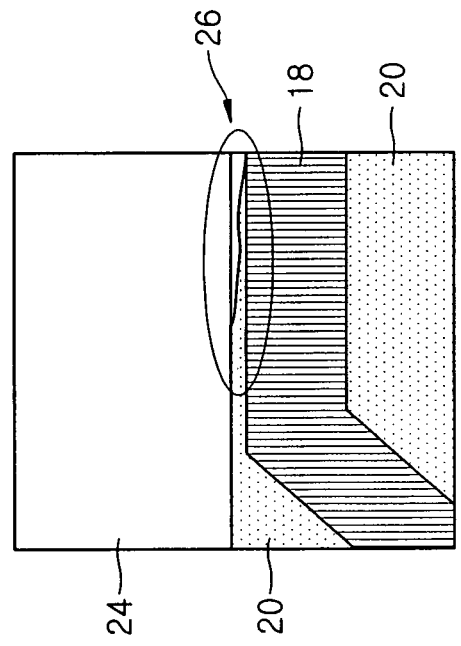
FIG. 2 (Prior Art) is an enlarged sectional view of a portion A of FIG. 1.
Figure 3:
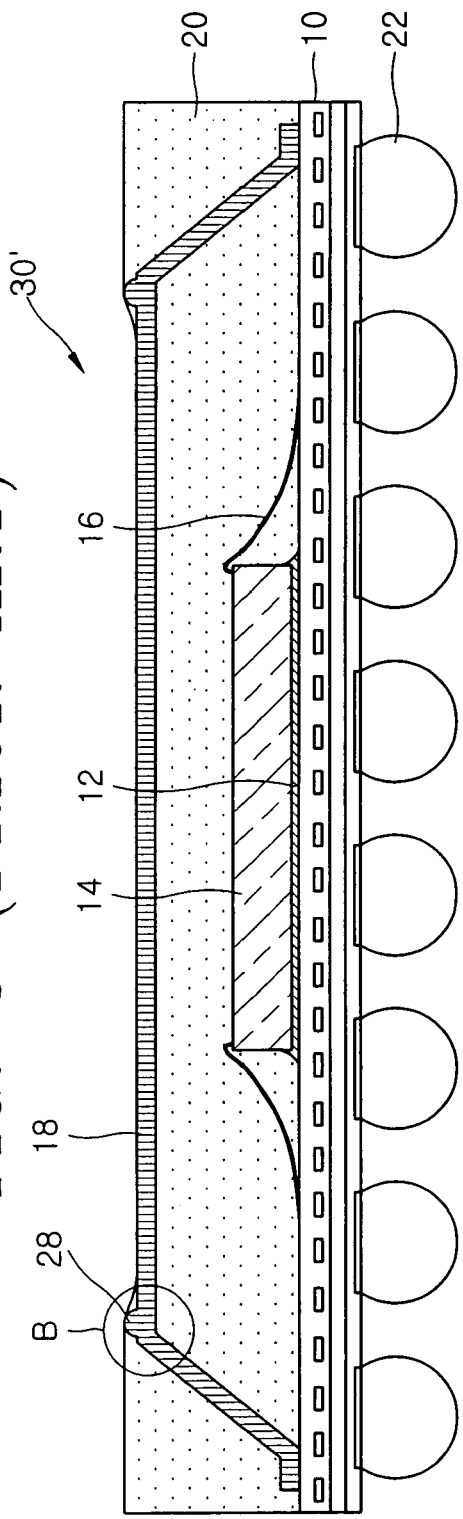
FIGS. 3 and 4 (Prior Art) are sectional views illustrating a conventional method for molding a semiconductor package.
Figure 4:
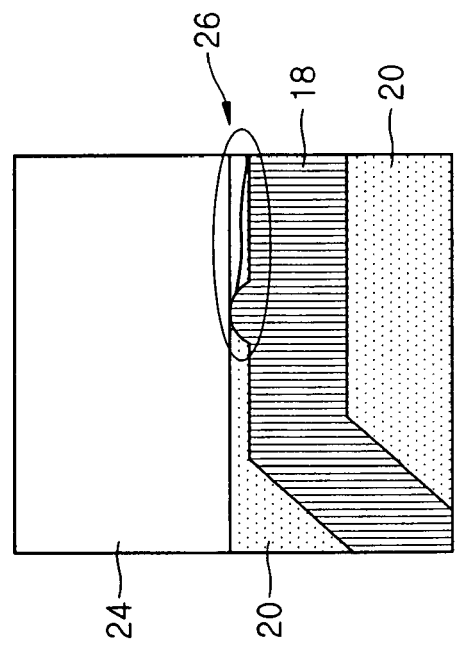
Figure 5:
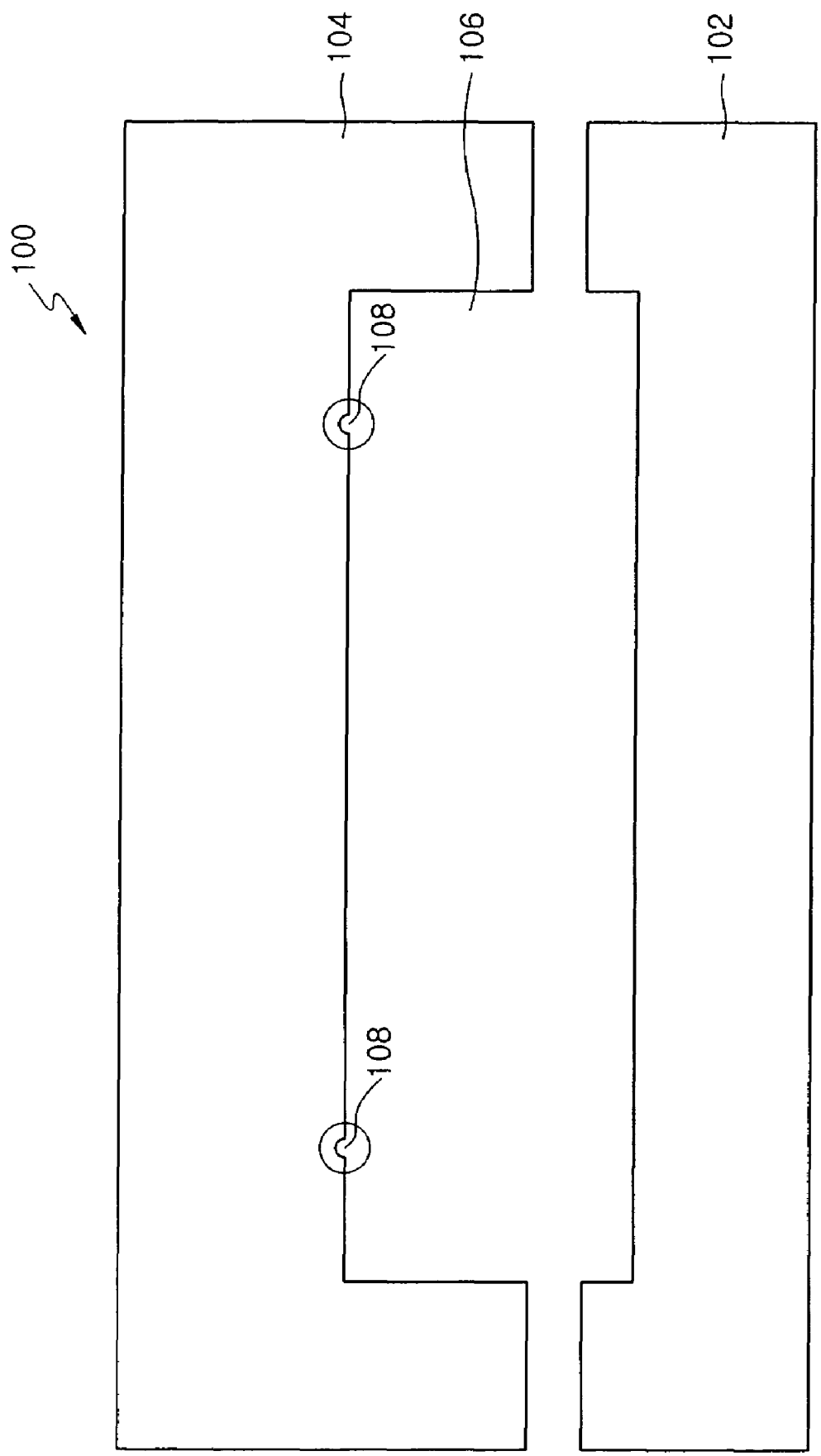
FIG. 5 is a sectional view of a semiconductor-packaging mold in accordance with a first embodiment of the present invention.

FIG. 5 shows a semiconductor-packaging mold in accordance with a first embodiment of the present invention.

Referring to FIG. 5, a semiconductor packaging mold of this embodiment includes first and second mold bodies 102 and 104, a cavity defined by the first and second mold bodies 102 and 104 to provide a molding space for a semiconductor package, and a groove 108 formed on a cavity surface of the second mold body 104 to prevent the resin bleed. That is, a feature of this embodiment is a resin bleed preventing formation, e.g., a groove formed in a closed-circle shape. The function of the groove 108 will be described later.

Figure 6:
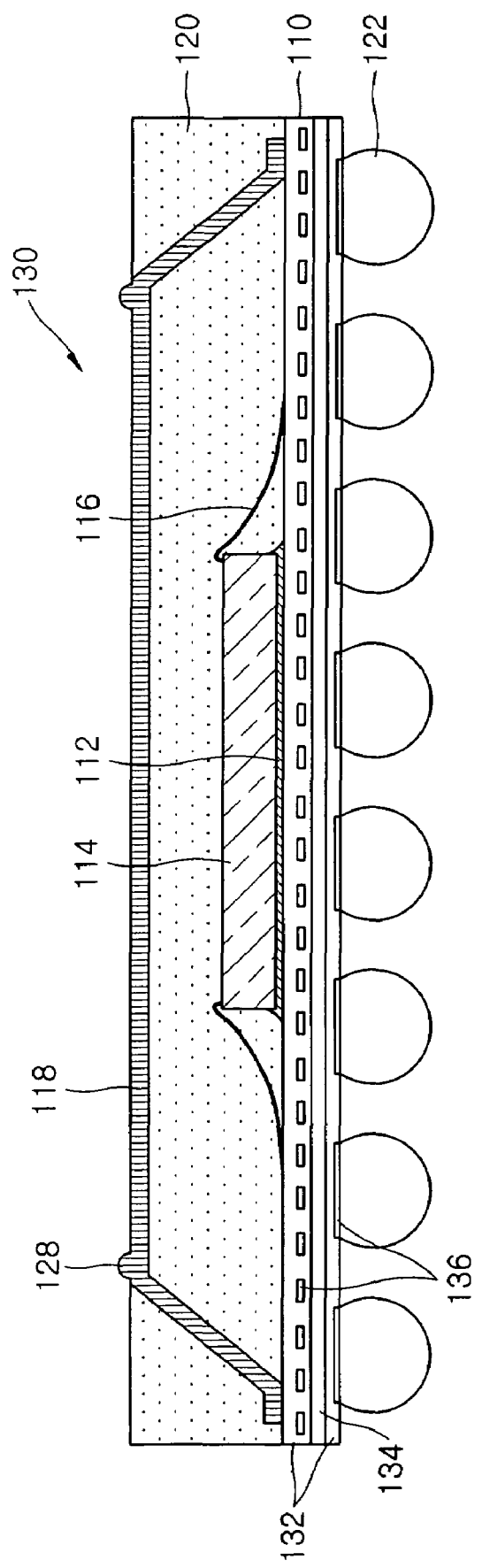
FIG. 6 is a sectional view of a semiconductor package molded by a semiconductor-packaging mold in accordance with a first embodiment of the present invention.

FIG. 6 shows a semiconductor package formed by the semiconductor-packaging mold of this embodiment.

Referring to FIG. 6, a semiconductor package 130 includes a basic frame 110. In the drawing, the basic frame 110 is formed of a printed circuit board. However, the present invention is not limited to this case. For example, the basic frame 110 may be formed of a lead frame. The semiconductor package 130 further includes a semiconductor chip 114 electrically connected to the basic frame 110 by a gold wire 116 and physically attached by a die adhesive. In this embodiment, although the semiconductor chip 114 is connected to the basic frame 110 via the gold wire 116, the present invention is not limited to this case. For example, the semiconductor chip 114 may be mounted through a flip chip bonding method using a solder bump.

The semiconductor package 130 further includes a heat spreader 118 provided with a dam 128 corresponding in shape and size to the groove 108 (FIG. 5). The heat spreader 118 may be partly exposed to an external side and covers an upper portion of the basic frame as well as the semiconductor chip 114. The heat spreader 118 may be formed of material useful for heat transmission. For example, the heat spreader 118 may be formed of a material selected from the group consisting of Cu, a Cu alloy, aluminum, and an aluminum alloy.

The semiconductor package 130 further includes a sealing resin 120 formed to leave externally exposed a surface portion of the heat spreader 118 while sealing the upper portion of the basic frame 110 as well as the semiconductor chip 114. A plurality of solder balls 122 attach on a bottom of the basic frame 110 and serve as external connection terminals. When the basic frame 110 is formed of the lead frame, leads may be used as the external connection terminal.

Figure 7:
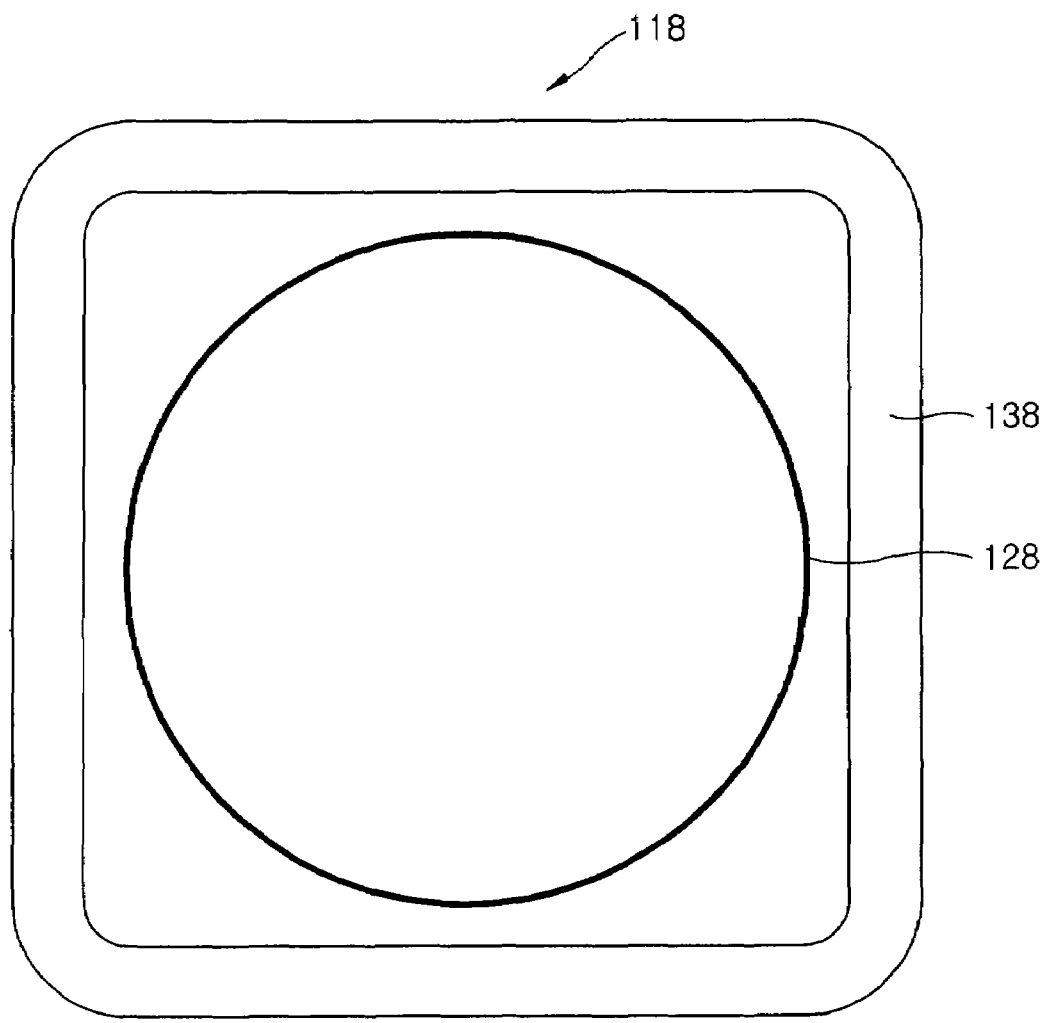
FIG. 7 is a top view of a heat spreader depicted in FIG. 6.
Figure 8:
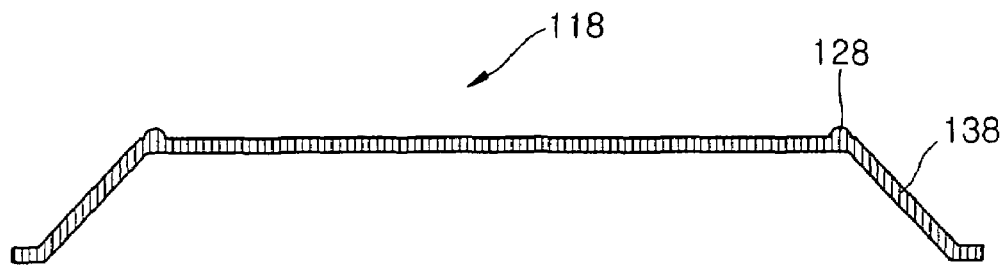
FIG. 8 is a sectional view of a heat spreader depicted in FIG. 6.

FIG. 7 is a top view of the heat spreader depicted in FIG. 6 while FIG. 8 is a sectional view of the heat spreader depicted in FIG. 6.

Referring to FIGS. 7 and 8, the heat spreader 118 is formed in a generally rectangular shape, four corners of which are rounded and an inclined surface 138 is formed about its edges. The inclined surface 138 is sealed by the sealing resin in the molding process. A center portion of the heat spreader 118, e.g., as bounded by the grove 128, is a flat surface to be left exposed after the molding process is finished. The closed shape, e.g., circular shaped, dam 128 is formed relative to the exposed flat surface.

Figure 9:
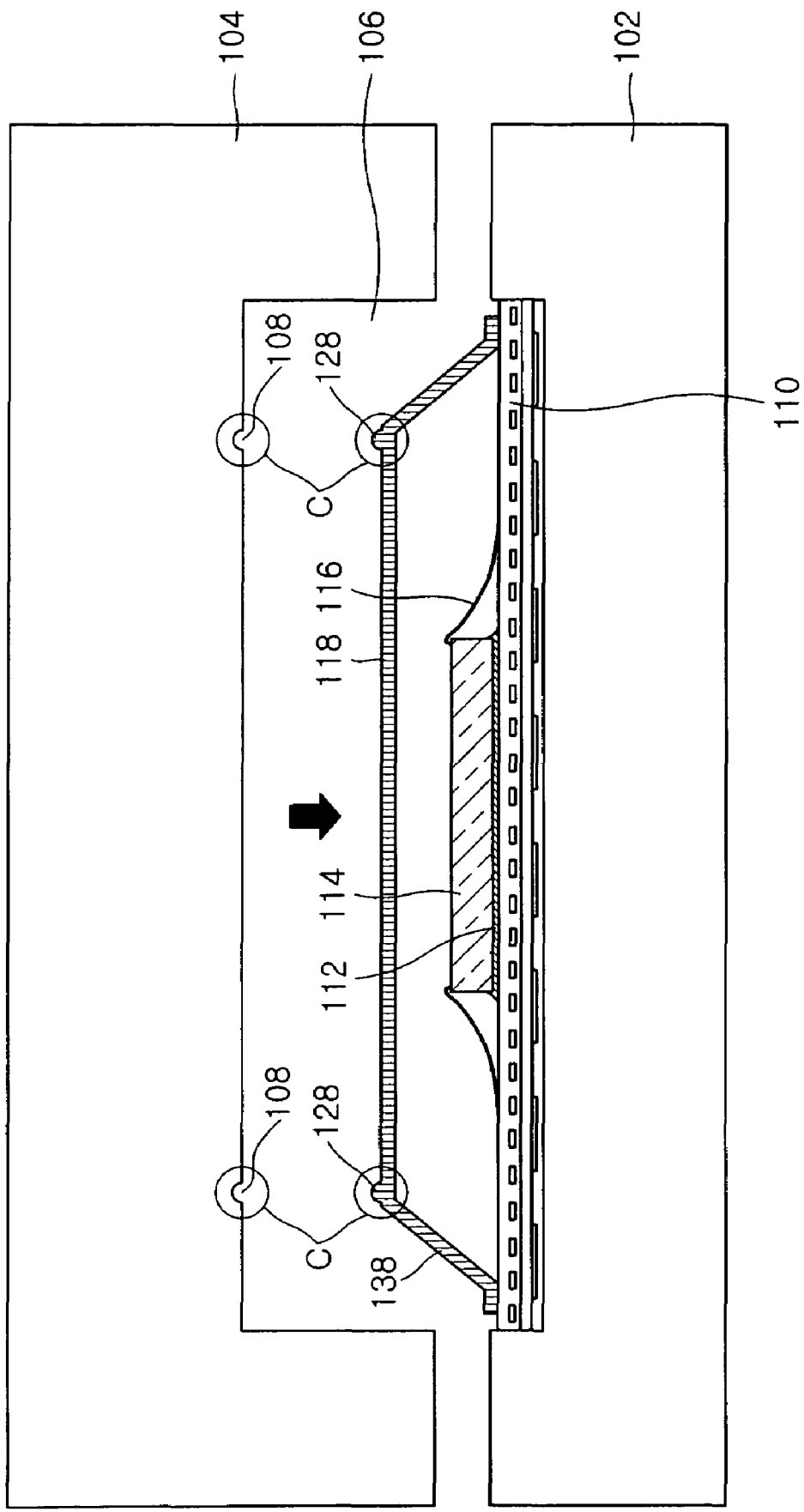
FIG. 9 is a sectional view illustrating a method of manufacturing a semiconductor package in accordance with a first embodiment of the present invention.
Figure 10:
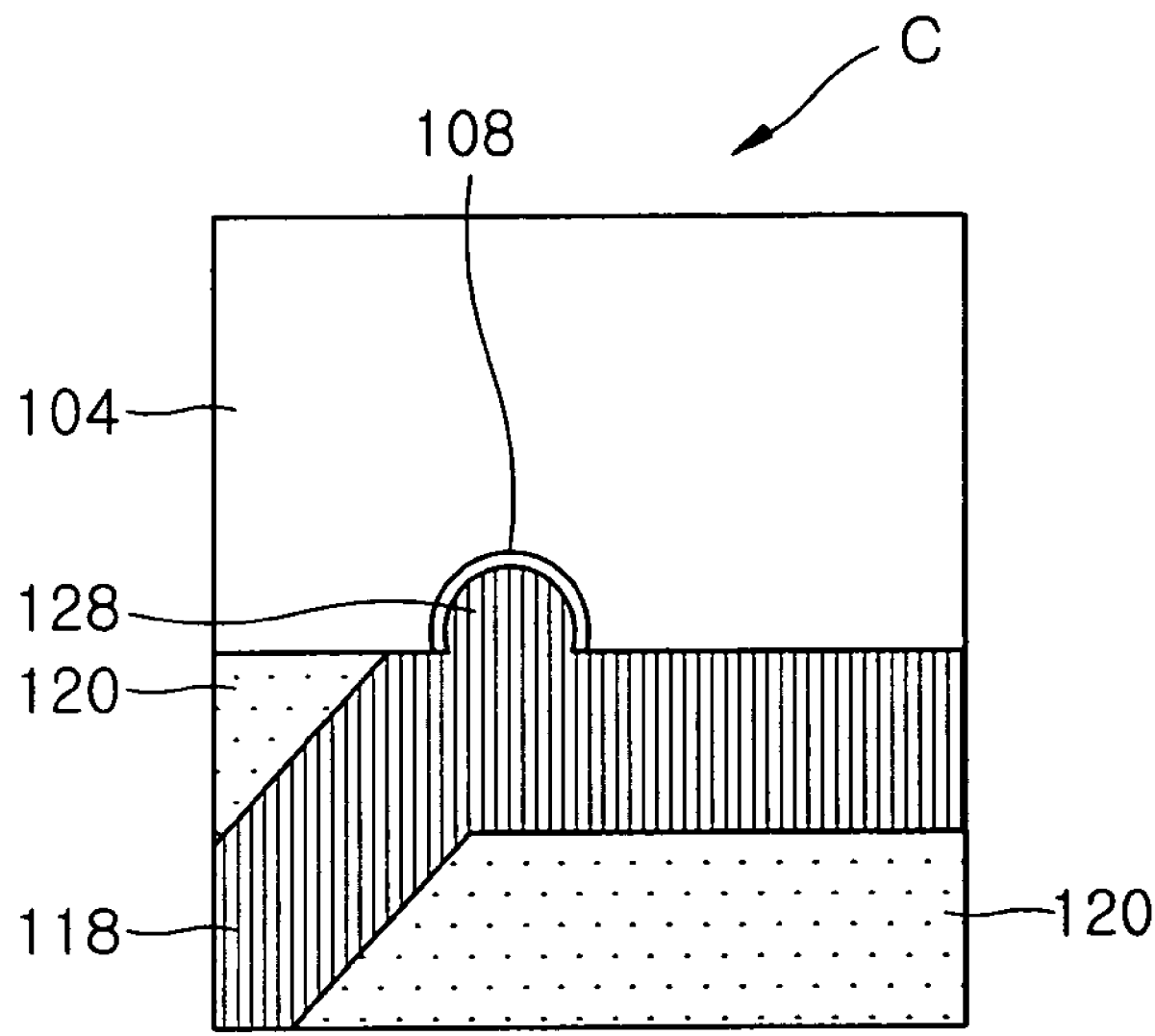
FIG. 10 is an enlarged view when a portion C of FIG. 9 is connected.

FIG. 9 illustrates a method of manufacturing the semiconductor package in accordance with a first embodiment of the present invention and FIG. 10 is an enlarged view when a portion C of FIG. 9 is connected.

Referring to FIGS. 9 and 10, the semiconductor packaging mold provided with the groove 108 formed on the cavity surface of the second mold body 104 is first provided. In the drawing, although the cross section of the groove 108 is formed in a semi-circular shape, the cross section of groove 100 may be formed in variety of shapes including but not limited to a triangular-shape, a rectangular-shape or other polygonal-shape. Further, the closed shape of groove 128, e.g., as seen in FIG. 7, need not be circular.

Then, the semiconductor package is loaded in the cavity 106. At this point, the semiconductor package, having at its surface the dam 128 corresponding in size, shape and location to the groove 108, rests in the cavity 106. The semiconductor package is already wire-bonded using the gold wire.

Finally, the molding process is performed using the sealing resin in a state where the groove 108 is interlocked with the dam 128 formed on the semiconductor package. Here, as shown in FIG. 10, the groove 108 formed on the cavity surface of the second mold body 104 is tightly interlocked with the dam 128 formed on the heat spreader 118 when the first and second molds 102 and 104 are clamped together. As a result of such mating compatibility, even when the ram pressure for injecting the sealing resin into the cavity 106 is increased, the bleeding of the sealing resin can be effectively blocked, thereby preventing the resin bleed defect.

Second Embodiment: A Resin Bleed Preventing Unit is Dam

Figure 11:
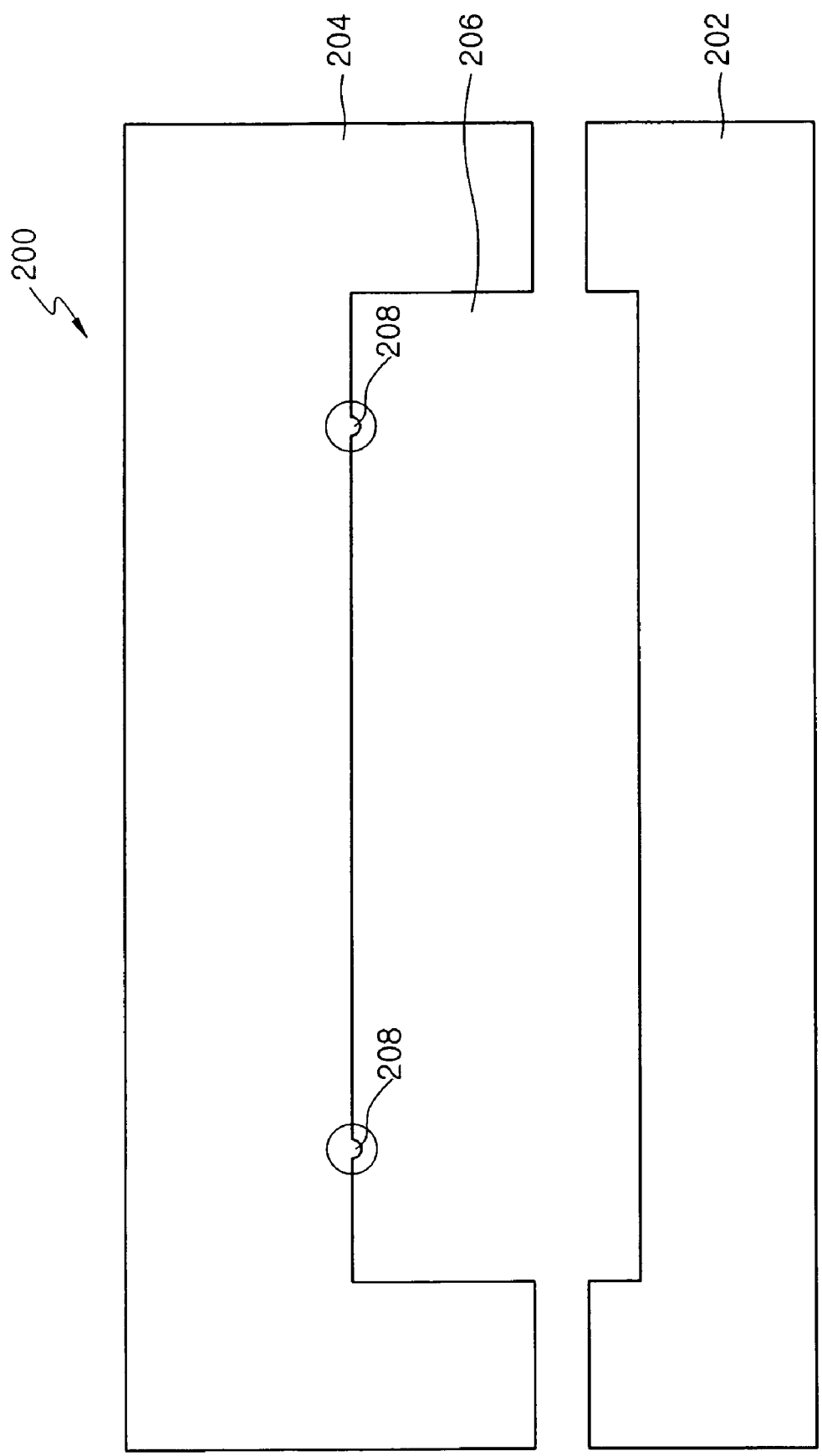
FIG. 11 is a sectional view of a semiconductor-packaging mold in accordance with a second embodiment of the present invention.

FIG. 11 shows a semiconductor-packaging mold in accordance with a second embodiment of the present invention;

Referring to FIG. 11, a semiconductor-packaging mold of this embodiment includes first and second molds 202 and 204, a cavity defined by the first and second molds 202 and 204 to provide a molding space for a semiconductor package, and a dam 208 formed on a cavity surface of the second mold body 204 to prevent the resin bleed. That is, a feature of this embodiment is that a resin bleed preventing unit is formed of a dam, and a groove corresponding to the dam 208 is formed on a heat spreader of a semiconductor package. Since other parts of this embodiment are similar to those of the first embodiment, the detailed description thereof will be omitted herein.

Figure 12:
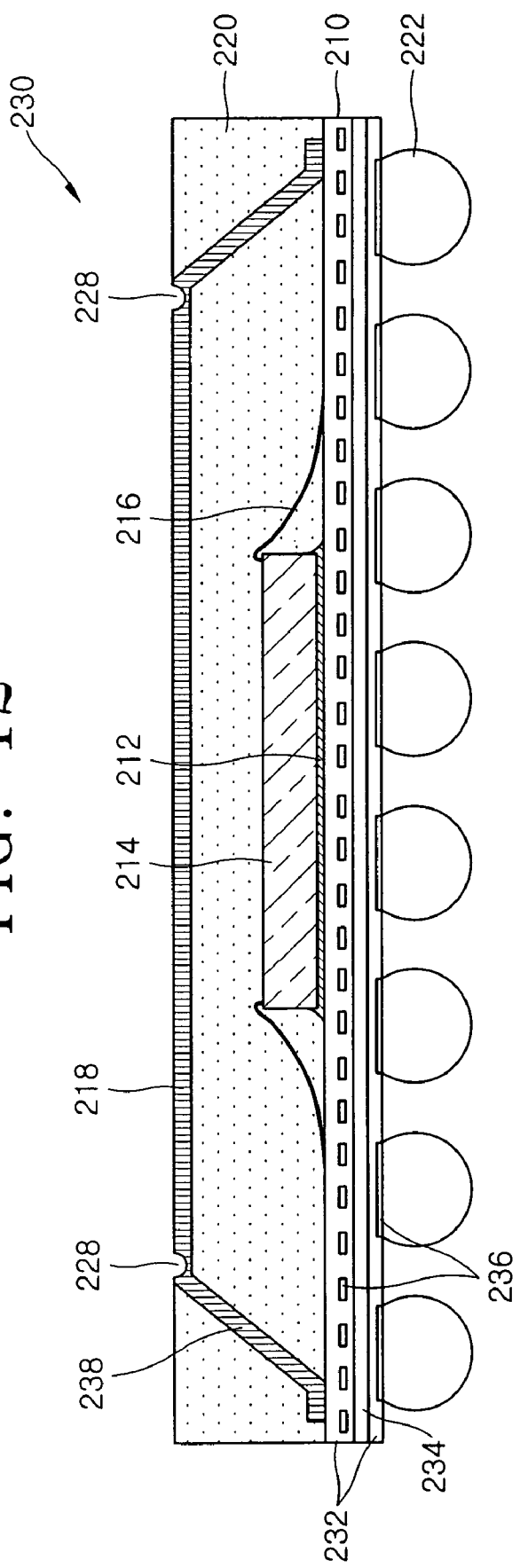
FIG. 12 is a sectional view of a semiconductor package molded by a semiconductor-packaging mold in accordance with a second embodiment of the present invention.

FIG. 12 shows a semiconductor package molded by the semiconductor-packaging mold of this embodiment.

Referring to FIG. 12, a semiconductor package 230 includes a basic frame 210 and a semiconductor chip 214 electrically connected to the basic frame 210. A heat spreader 218 provided with the groove 228 corresponding to the dam (referring to the reference numeral 208 of FIG. 11) is partly exposed to an external side while covering an upper portion of the basic frame 210 as well as the semiconductor chip 214. A sealing resin 220 is formed to leave exposed a part of the heat spreader 218 while sealing the upper portion of the basic frame 210 as well as the semiconductor chip 214. A plurality of solder balls 222 attach on a bottom of the basic frame 210 and serve as external connection terminals. It will be understood by those of ordinary skill in the art that various modifications of the semiconductor package 230 will be possible.

Figure 13:
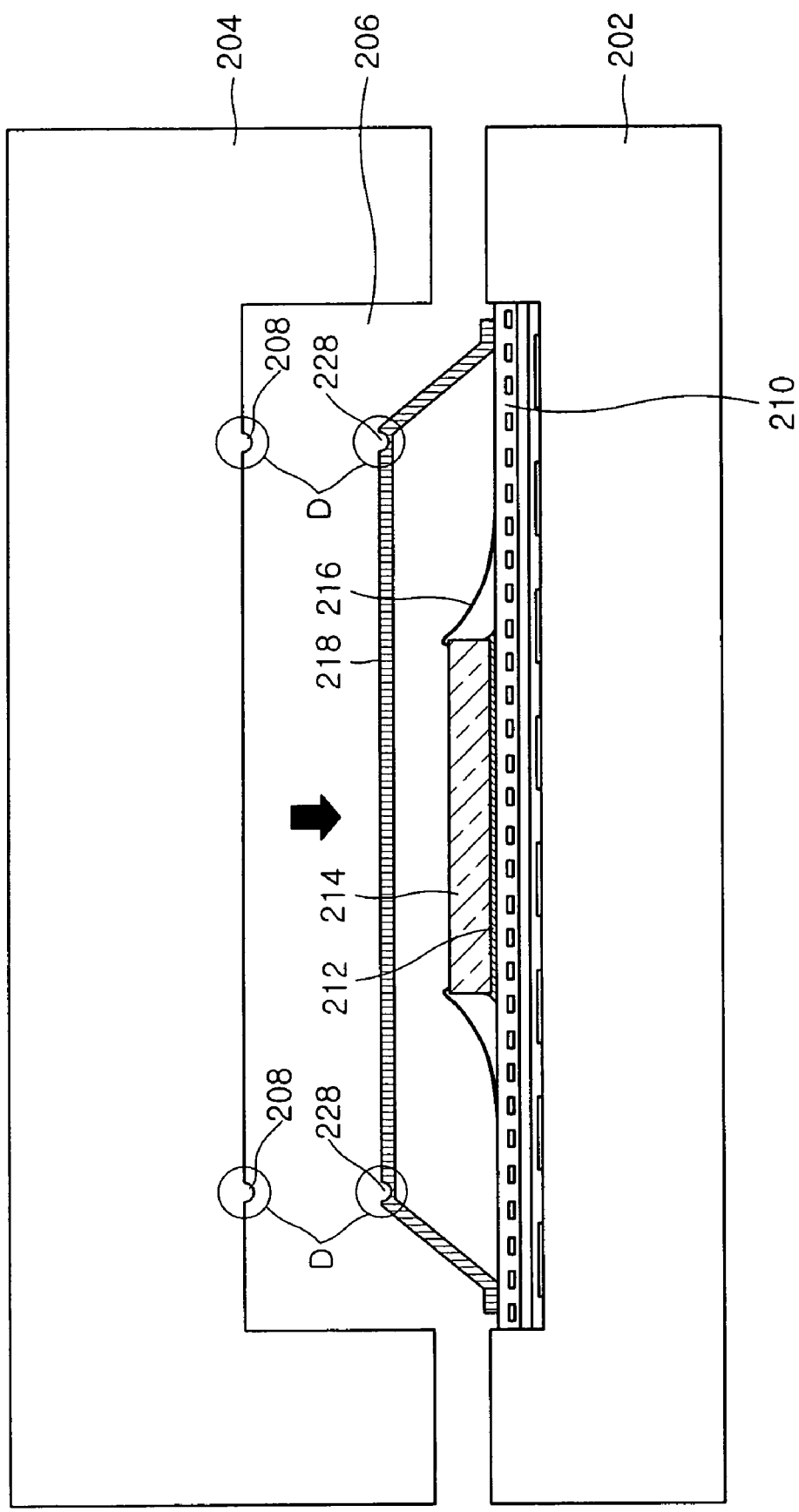
FIG. 13 is a sectional view illustrating a method of manufacturing a semiconductor package in accordance with a second embodiment of the present invention.
Figure 14:
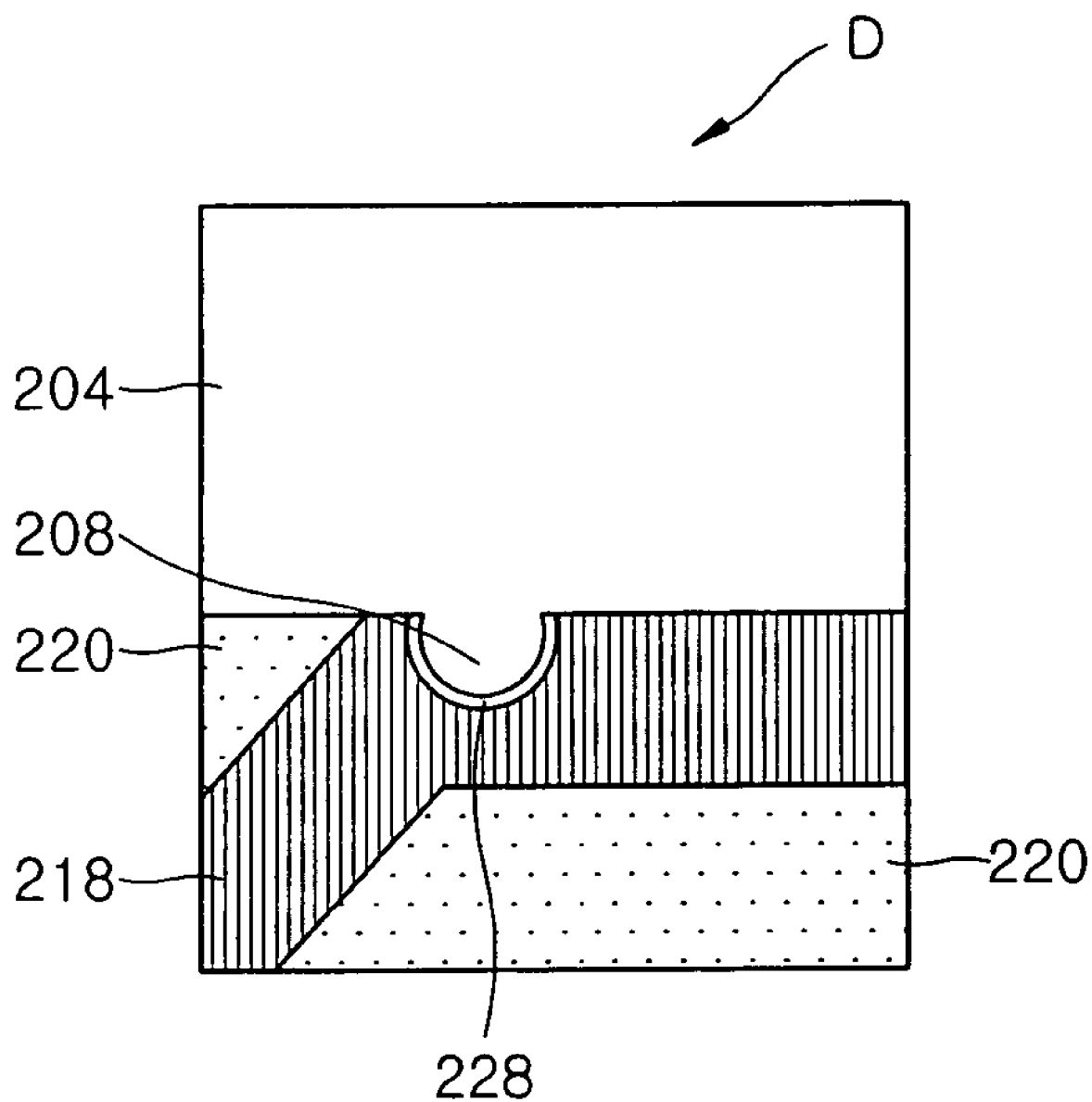
FIG. 14 is an enlarged view when a portion C of FIG. 13 is connected.

FIG. 13 illustrates a method of manufacturing the semiconductor package in accordance with a first embodiment of the present invention and FIG. 14 is an enlarged view when a portion C of FIG. 13 is interlocked.

Referring to FIGS. 13 and 14, the semiconductor packaging mold provided with the dam 208 formed on the cavity surface of the second mold body 204 is first provided. Then, the semiconductor package is loaded in the cavity 206. At this point, the heat spreader of the semiconductor package, having at its surface with the groove 218 corresponding to the dam 208, rests in the cavity 206. The semiconductor package is already wire-bonded using the gold wire.

Finally, the molding process is performed using the sealing resin in a state where the dam 208 formed on the cavity surface of the second mold body 204 is interlocked, e.g., matingly compatible, with the groove 228 formed on the semiconductor package. Here, as shown in FIG. 14, the dam 208 formed on the cavity surface of the second mold body 204 is tightly interlocked with the groove 228 formed on the heat spreader 218 when the first and second mold bodies 202 and 204 are clamped. As a result, even when the ram pressure for injecting the sealing resin into the cavity 206 is increased, the bleeding of the sealing resin can be effectively blocked, thereby preventing the resin bleed defect. At this point, since the dam 208 and the groove 228 are formed in a closed shape, e.g., a circular shape, the sealing resin does not bleed to the inner portion enclosed or bounded by the groove 228 even after the molding process is finished.

According to the above-described embodiments, by physically modifying the structure of the mold to disallow the resin to bleed during the molding process, the resin bleed defect can be prevented, thereby improving the thermal property of the semiconductor package.

While embodiments of the present invention have been particularly shown and described, it will be understood by those of ordinary skill in the art that various changes in form and details may be made therein without departing from the spirit and scope of the present invention as defined by the following claims.

For example, in the above embodiments, although a BGA package with the heat spreader is shown, the present invention is not limited to this case. For example, the present invention may be applied to other semiconductor packages such as a TSOP, TQFP, QFN, and CSP. Although a surface structure corresponding to the resin bleed preventing unit of the mold is formed on the heat spreader, the present invention is not limited to this case. For example, the surface structure may be formed on a lead frame or a printed circuit board.

What is claimed is:

1. A semiconductor packaging mold comprising:
   first and second mold bodies;
   a cavity defined by the first and second mold bodies to provide a space to receive a semiconductor package to be molded; and
   a first formation bounding a central portion of a surface of the cavity, wherein the first formation comprises a groove, wherein the semiconductor package comprises a heat spreader provided with a dam corresponding to the groove, and wherein the first formation is formed to correspond to a matingly compatible second formation bounding a central portion of a surface of the semiconductor package to be molded.

2. The mold of claim 1, wherein the first formation is located on the first mold body, the first mold body being disposed above the second mold body.

3. The mold of claim 1, wherein the groove is formed in a closed shape.

4. The mold of claim 3, wherein the closed shape is a circular shape.

5. The mold of claim 3, wherein a cross sectional shape of the groove is a semicircular shape.

6. The mold of claim 1, wherein the heat spreader is chosen from Cu, a Cu alloy, aluminum, and an aluminum alloy.

7. A semiconductor packaging mold comprising:
   first and second mold bodies;
   a cavity defined by the first and second mold bodies to provide a space to receive a semiconductor package to be molded; and
   a first formation bounding a central portion of a surface of the cavity, wherein the first formation comprises a dam and wherein the semiconductor package comprises a heat spreader provided with a groove corresponding to the dam, and wherein the first formation is formed to correspond to a matingly compatible second formation bounding a central portion of a surface of the semiconductor package.

8. The mold of claim 7, wherein the dam is formed in a closed shape.

9. The mold of claim 8, wherein the closed shape is a circular shape.

10. The mold of claim 7, wherein the groove and the dam are matingly compatible in size, shape and location to interlock during the molding process.

11. A semiconductor packaging mold comprising:
    a mold body;
    a cavity defined by the mold body to provide a space to receive a semiconductor package to be molded; and
    a non-planar resin bleed preventing formation on a surface of the cavity, wherein the non-planar resin bleed preventing formation comprises a groove, and wherein the semiconductor package comprises a heat spreader provided with a dam corresponding to the groove.

12. The mold of claim 11, wherein the non-planar resin bleed preventing formation corresponds to a matingly compatible formation of the semiconductor package to be molded.

* * * * *